United States Patent
Biswas et al.

(10) Patent No.: US 11,658,624 B2
(45) Date of Patent: May 23, 2023

(54) VOLTAGE GAIN AMPLIFIER ARCHITECTURE FOR AUTOMOTIVE RADAR

(71) Applicant: STMicroelectronics International N.V., Geneva (CH)

(72) Inventors: Riju Biswas, Gautam Buddha Nagar (IN); Ratul Mitra, Noida (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 17/461,123

(22) Filed: Aug. 30, 2021

(65) Prior Publication Data
US 2021/0391837 A1    Dec. 16, 2021

Related U.S. Application Data

(63) Continuation of application No. 16/861,602, filed on Apr. 29, 2020, now Pat. No. 11,121,687.

(51) Int. Cl.
*H03F 3/45* (2006.01)

(52) U.S. Cl.
CPC ..... *H03F 3/45085* (2013.01); *H03F 3/45475* (2013.01); *H03F 2203/45006* (2013.01); *H03F 2203/45026* (2013.01); *H03F 2203/45048* (2013.01); *H03F 2203/45084* (2013.01); *H03F 2203/45088* (2013.01); *H03F 2203/45211* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,493,205 A | * | 2/1996 | Gorecki | H03F 3/45179 330/288 |
| 5,530,403 A | * | 6/1996 | Bushman | H03F 3/45076 330/253 |

(Continued)

FOREIGN PATENT DOCUMENTS

| | | |
|---|---|---|
| EP | 0534007 A1 | 3/1993 |
| KR | 1020150060255 A | 6/2015 |

OTHER PUBLICATIONS

European Search Report for co-pending EP Appl. No. 21170504.1 dated Sep. 10, 2021 (12 pages).

(Continued)

*Primary Examiner* — Patricia T Nguyen
(74) *Attorney, Agent, or Firm* — Crowe & Dunlevy

(57) ABSTRACT

Disclosed herein is a method including sinking current from a pair of input transistors of a differential amplifier while sourcing more current to the pair of input transistors than is sunk. The method further includes generating a pair of input differential signals using a pair of input voltage regulators, and amplifying a difference between the pair of input differential signals to produce a pair of differential output voltages, using the differential amplifier. The method also includes amplifying the pair of differential output voltages using at least one voltage gain amplifier, and generating control signals for current sources that source the current to the pair of input transistors of the differential amplifier, from the pair of differential output voltages after at least amplification.

17 Claims, 2 Drawing Sheets

(56) References Cited

U.S. PATENT DOCUMENTS

| | | | |
|---|---|---|---|
| 8,050,642 B2 | 11/2011 | Kim et al. | |
| 8,169,263 B2 * | 5/2012 | Bofill-Petit | H03F 3/45197 |
| | | | 330/260 |
| 8,456,236 B2 | 6/2013 | Moldsvor et al. | |
| 10,312,877 B2 | 6/2019 | Matsuno et al. | |
| 2003/0071678 A1 * | 4/2003 | Paulus | H03F 3/265 |
| | | | 327/538 |
| 2005/0242874 A1 * | 11/2005 | Lind | H03F 3/217 |
| | | | 330/10 |
| 2006/0061415 A1 | 3/2006 | Bhattacharjee et al. | |
| 2006/0284671 A1 | 12/2006 | Ohba | |
| 2007/0188229 A1 | 8/2007 | Abdelli | |
| 2011/0074505 A1 | 3/2011 | Chiang et al. | |
| 2015/0171811 A1 | 6/2015 | Wu et al. | |
| 2017/0272036 A1 | 9/2017 | Wu et al. | |
| 2018/0262374 A1 | 9/2018 | Cheng et al. | |
| 2019/0081604 A1 | 3/2019 | Thiagarajan et al. | |
| 2019/0140609 A1 | 5/2019 | Taghizadeh Ansari et al. | |
| 2019/0363686 A1 | 11/2019 | Grasso | |

OTHER PUBLICATIONS

Koyama M et al: "A 2.5-V Active Low-Pass Filter Using ALL-N-P-N Gilbert Cells With A1-VP-P Linear Input Range", IEEE Journal of Solid-State Circuits, IEEE, USA, vol. 28, No. 12, Dec. 1, 1993 (Dec. 1, 1993), pp. 1246-1252, XP000435897.

* cited by examiner

VOLTAGE GAIN AMPLIFIER ARCHITECTURE FOR AUTOMOTIVE RADAR

RELATED APPLICATION

This application is a continuation of U.S. patent application Ser. No. 16/861,602, filed Apr. 29, 2020, the contents of which are incorporated by reference in their entirety to the maximum extent allowable under the law.

TECHNICAL FIELD

This disclosure is related to the field of voltage gain amplifiers for use in the receiver chain of automotive radar devices and, in particular, to a voltage gain amplifier design that increases the operating margin of the transistors of its differential amplifier, maintains linearity regardless of fluctuation of the input common mode voltage, increases the transconductance of the transistors of its differential amplifier in high gain operation, and cancels the DC offset between input differential voltage signals.

BACKGROUND

Radar systems are now regularly used in driver assistance systems in automobiles, such as for determining the distance to other vehicles and objects near the vehicle that is utilizing the radar system. As one example, the cruise control systems of vehicles may utilize radar such that, in the absence of a nearby vehicle in front of the vehicle utilizing the radar system, a set speed is maintained by the vehicle utilizing the radar system, yet when a nearby vehicle is present in front of the vehicle utilizing the radar system, the vehicle utilizing the radar system slows down to maintain a set distance between itself and the nearby vehicle.

Such a radar system includes a transmit chain to transmit radio waves, and a receive chain to receive radio waves that have reflected off a nearby vehicle or object and returned to the vehicle employing the radar system. By analyzing the received radio waves, the distance to the nearby vehicle or object can be determined.

While such radar systems for use in vehicles exist, there is a desire for the development of improved systems having greater linearity, reduced noise, offset cancelation, and with a full output swing matching the full scale range of the ADC used by those systems.

SUMMARY

Disclosed herein is a method including: sinking current from a pair of input transistors of a differential amplifier while sourcing more current to the pair of input transistors than is sunk; generating a pair of input differential signals using a pair of input voltage regulators, and amplifying a difference between the pair of input differential signals to produce a pair of differential output voltages, using the differential amplifier; amplifying the pair of differential output voltages using at least one voltage gain amplifier; and generating control signals for current sources that source the current to the pair of input transistors of the differential amplifier, from the pair of differential output voltages after at least amplification.

The control signals for the current sources may be generated so as to maintain a constant voltage across the pair of input transistors.

A transconductance of the pair of input transistors of the differential amplifier may be increased without increasing a common mode voltage by increasing the current sourced to the pair of input transistors in equal magnitude to an increase in the current sunk from the pair of input transistors.

The differential amplifier may be calibrated by shorting inputs to the pair of input voltage regulators to one another, comparing the pair of differential output voltages to one another, and adjusting the control signals for the current sources based upon the comparison so that the pair of differential output voltages are equal.

The pair of differential output voltages may be low-pass filtered.

Also disclosed herein is a circuit, including: a differential amplifier formed by first and second input transistors receiving first and second regulated input differential voltage, the first and second input transistors being coupled in a differential arrangement between first and second current sourcing circuits and first and second current sinking circuits, wherein the first and second current souring circuits are configured to source more current than is sunk by the first and second current sinking circuits; and an output amplification circuit coupled to amplify differential output voltages from the differential amplifier to thereby produce final differential output voltages.

The differential amplifier may include first and second resistances coupled in series between a first node at which the first input transistor and the first current sinking circuit are coupled and a second node at which the second input transistor and the second current sinking circuit are coupled.

A first amplifier may be configured to generate an adjustment signal for the first and second current sourcing circuits based upon a difference between an input common mode reference voltage and a voltage at a tap between the first and second resistances.

An input common mode voltage may be produced at the tap between the first and second resistances. The first regulated input differential voltage may be equal to a first input voltage plus the input common mode voltage, and the second regulated input differential voltage may be equal to a second input voltage plus the input common mode voltage.

The first amplifier may adjust the currents sourced by the first and second current sourcing circuits such that voltages across the first and second input transistors remain constant as the input common mode voltage changes with respect to the input common mode reference voltage.

An adjustment circuit may be configured to adjust the currents sourced by the first and second current sourcing circuits based upon the final differential output voltages.

The adjustment circuit may adjust the currents sourced by the first and second current sourcing circuits so as to increase a magnitude in currents sourced by the first and second current sourcing circuits equally to increases in magnitude of the currents sunk by the first and second current sinking circuits.

The adjustment circuit may include a comparator that generates control signals for the first and second current sourcing circuits based upon a comparison between the final differential output voltages.

A filter may be configured to filter the differential output voltages.

Also disclosed herein is a differential amplifier having: first and second input transistors receiving first and second regulated input differential voltage, the first and second input transistors being coupled in a differential arrangement between first and second current sourcing circuits and first and second current sinking circuits, wherein the first and second current souring circuits are configured to source more current than is sunk by the first and second current sinking circuits; an output amplification circuit coupled to amplify different output voltages from the differential amplifier to thereby produce final differential output voltages; and adjustment circuitry, wherein the currents sourced by the first and second current sourcing circuits are adjusted by the adjustment circuitry such that voltage across the first and second input transistors remain constant, and such that the currents sourced by the first and second current sourcing circuits are adjusted in magnitude with adjustment to magnitude of the currents sunk by the first and second current sinking circuits.

The differential amplifier may include first and second resistances coupled in series between a first node at which the first input transistor and the first current sinking circuit are coupled and a second node at which the second input transistor and the second current sinking circuit are coupled.

The first and second current sourcing circuits may be adjusted by the adjustment circuitry such that the voltage across the first and second input transistors remains constant based upon a comparison between an input common mode reference voltage and a voltage at a tap between the first and second resistances, and such that the currents sourced by the first and second current sourcing circuits are adjusted in magnitude with adjustment to magnitude of the currents sunk by the first and second current sinking circuits based upon a comparison between the final differential output voltages.

A filter may be configured to filter the differential output voltages.

Also disclosed herein is a circuit, including a voltage gain amplifier having: a first fixed current source configured to source a first current, and a second fixed current source configured to source a second current; a third fixed current source configured to sink a third current, and a fourth fixed current source configured to sink a fourth current; a first transistor having a first conduction terminal coupled to the first fixed current source, a second conduction terminal coupled to the third fixed current source, and a control terminal coupled to receive a first regulated differential input voltage; a first input amplifier having a first input receiving a first differential input signal, a second input coupled to the emitter of the first transistor, and an output generating the first regulated differential input voltage; a second transistor having a first conduction terminal coupled to the second fixed current source, a second conduction terminal coupled to the fourth fixed current source, and a control terminal coupled to receive a second regulated differential input voltage; and a second input amplifier having a first input receiving a second differential input signal, a second input coupled to the emitter of the second transistor, and an output generating the second regulated differential input voltage.

The voltage gain amplifier may include an output amplifier having inputs coupled to the first conduction terminals of the first and second transistors to receive differential output voltages therefrom, and outputs generating amplified differential output voltages therefrom.

The voltage gain amplifier may include a resistance coupled between the second conduction terminals of the first and second transistors.

The voltage gain amplifier may also include: a first adjustable current source coupled in parallel with the first fixed current source; a second adjustable current source coupled in parallel with the second fixed current; and an amplifier having a first input coupled to a center tap of the resistance and a second input coupled to a reference voltage, wherein the amplifier has an output at which a control signal of the first and second adjustable current sources is generated.

The voltage gain amplifier may include: a third adjustable current source coupled in parallel with the first fixed current source and the first adjustable current source; a fourth adjustable current source coupled in parallel with the second fixed current source and the second adjustable current source; a fifth adjustable current source coupled in parallel with the third fixed current source; and a sixth adjustable current source coupled in parallel with the fourth fixed current source.

An additional voltage gain amplifier may have inputs receiving the amplified differential output voltages and outputs generating further amplified differential output voltages, and a low pass filter may be configured to filter the further amplified differential output voltages to produce final differential output voltages.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 1:
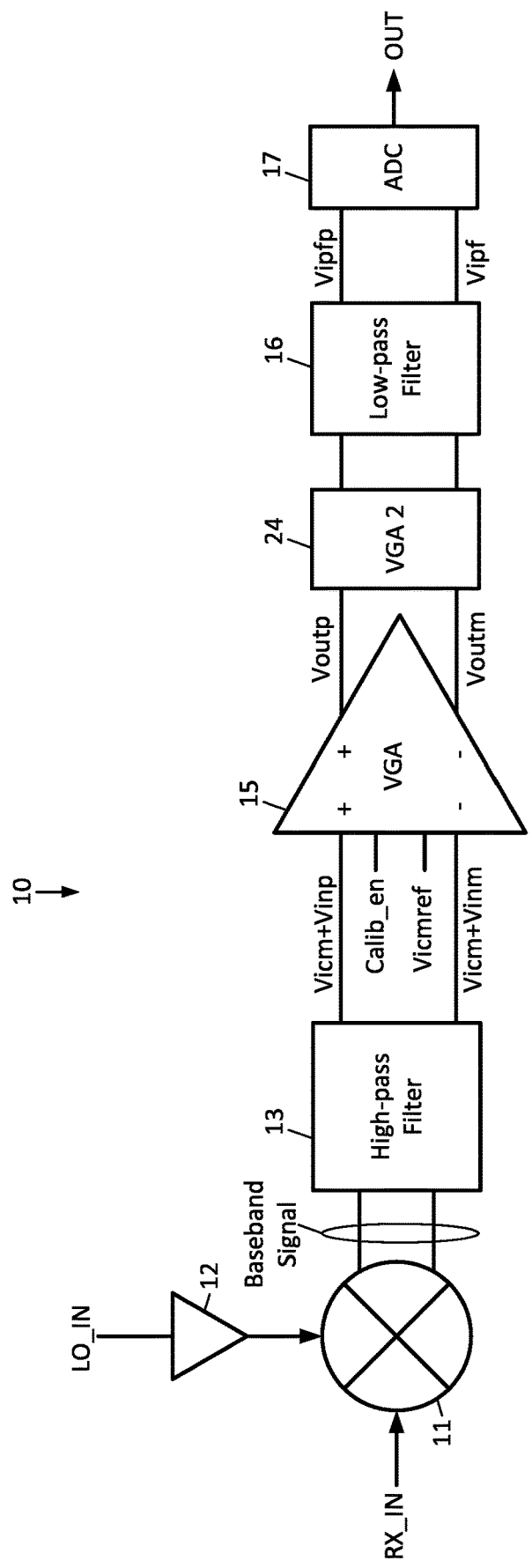
FIG. 1 is a block diagram of a receive chain of a vehicular radar system including a voltage gain amplifier design to be described herein.

With reference to FIG. 1, a receive chain 10 for a vehicular radar system is now described. The receive chain 10 includes a mixer 11, which receives an input radiofrequency signal RX_IN from a radar wave receiver. This input radiofrequency signal RX_IN represents radar waves that have reflected off a target and returned to the receive chain 10.

A local oscillator output LO_IN is amplified by an amplifier 12, and the mixer 11 mixes the amplified local oscillator output LO_IN with the input radiofrequency signal RX_IN to produce a baseband signal. A high pass filter 13 filters the baseband signal to attenuate the DC spur and outputs the baseband signal in differential form. The outputs of the high pass filter 13 are the differential signals Vinp and Vinm, and each output also carries the input common mode voltage Vicm.

A voltage gain amplifier (VGA) 15 disclosed herein receives the differential input signal Vinp+Vicm at its non-inverting input terminal, receives the differential input signal Vinm+Vicm at its inverting input terminal, receives a calibration enable signal Calib_en, and receives an input common mode reference signal Vicmref. The VGA 15 generates the output differential signals Voutp and Voutm, which are received as input by a second voltage gain amplifier (VGA 2) 24 that provides further amplification.

Note that the second VGA 24 may be of any design, and in some instances does not have the same structure and function as the VGA 15. Output of the second VGA 24 is received and filtered by the low-pass filter 16 to produce the output differential signals Vlpfp and Vlpfm, which are then converted to the digital domain by the analog to digital converter (ADC) 17. The digital signal output OUT from the ADC 17 can be used to determine the distance between the vehicle into which the receive chain 10 is integrated and nearby vehicles or objects.

Figure 2:
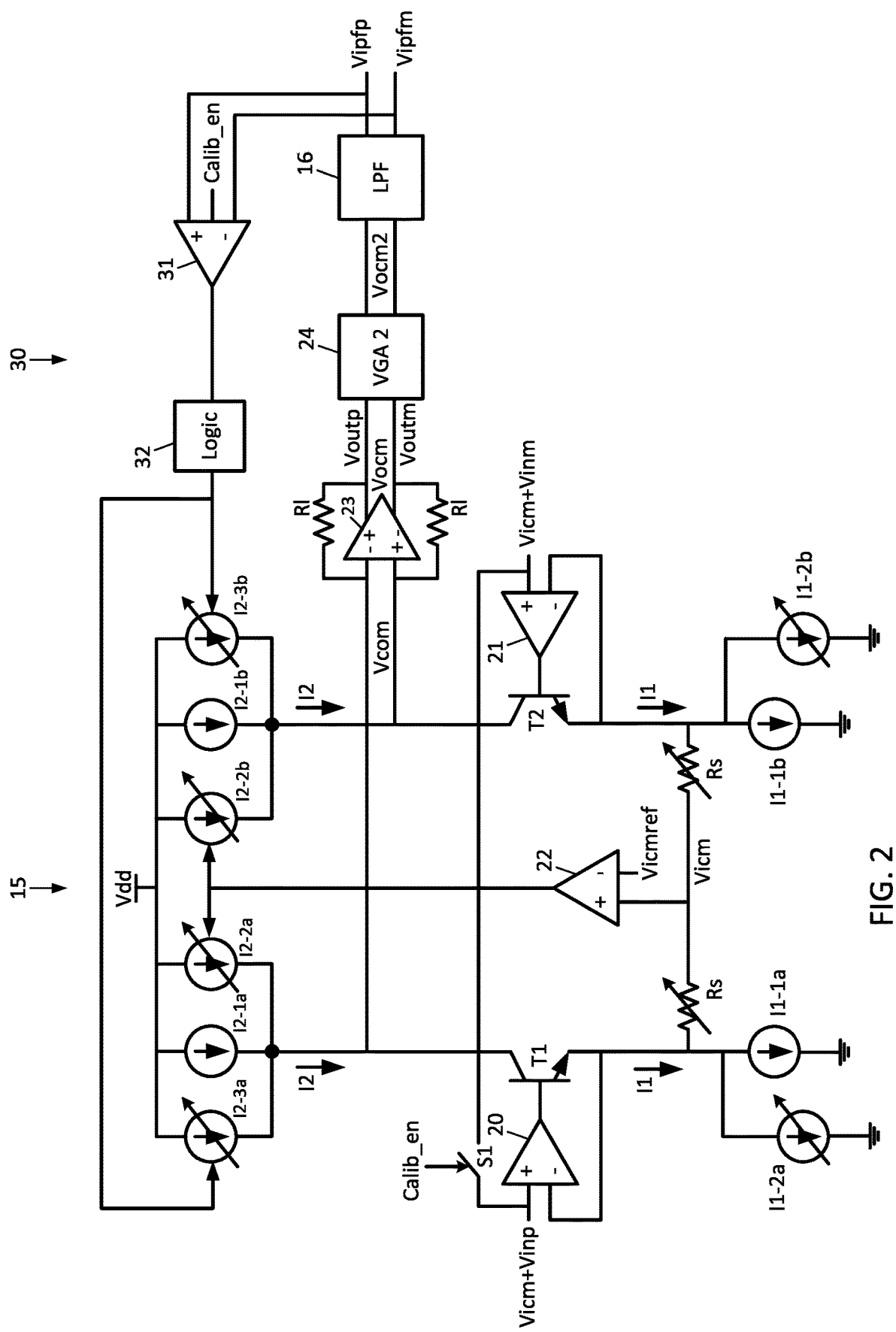
FIG. 2 is a schematic diagram of the voltage gain amplifier of FIG. 1.

The structure and operation of the VGA 15 is now described with reference to FIG. 2. In particular, the structure is first described, and thereafter, the operation will be described.

The VGA 15 is comprised of a differential pair of NPN bipolar junction transistors T1 and T2. A first amplifier 20 configured as a buffer receives the differential input signal Vinp+Vicm at its non-inverting input, has its inverting input coupled to the emitter of the transistor T1, and provides its output to the base of the transistor T1. Similarly, a second amplifier 21 configured as a buffer receives the differential input signal Vinm+Vicm at its non-inverting input, has its inverting input coupled to the emitter of the transistor T2, and provides its output to the base of the transistor T2. A switch S1 is closed to selectively connect the non-inverting terminals of the amplifiers 20 and 21 when the calibration enable signal Calib_en is high, and is otherwise open.

The emitters of the transistors T1 and T2 are coupled to one another through the series connected adjustable resistors Rs. A fixed tail current source I1-1a and an adjustable tail current source I1-2a are coupled in parallel and configured to sink current I1 from the emitter of the transistor T1. Similarly, a fixed tail current source I1-1b and an adjustable tail current source I1-2b are coupled in parallel and configured to sink current I1 from the emitter of the transistor T2.

A fixed current source I2-1a and adjustable current sources I2-2a and I2-3a are coupled in parallel and configured to source current I2 to the collector of the transistor T1. Similarly, a fixed current source I2-1b and adjustable current sources I2-2b and I2-3b are coupled in parallel and configured to source current I2 to the collector of the transistor T2.

An amplifier 22 has its non-inverting terminal connected to the center tap between resistors Rs, its inverting terminal receiving the input common mode reference signal Vicmref, and provides its output as an adjustment signal for the current sources I2-2a and I2-2b.

An amplifier 23 has its non-inverting terminal coupled to the collector of the transistor T2, and its inverting terminal coupled to the collector of the transistor T1. A positive feedback resistor R1 is coupled between the inverting terminal and non-inverting output of the amplifier 23, and a negative feedback resistor R1 is coupled between the non-inverting terminal and the inverting output of the amplifier 23. The amplifier 23 produces differential output signals Voutp and Voutm, which are amplified by the second voltage gain amplifier 24 and then filtered by the low pass filter 16 to produce differential output signals Vlpfp and Vlpfm.

A comparator 31 has its inverting terminal coupled to receive the differential output signal Vlpfm and its non-inverting terminal coupled to receive the differential output signal Vlpfp (see, FIG. 1), and is enabled by the calibration enable signal Calib_en. The output of the comparator 31 is passed to the logic circuit 32, which generates a compensation voltage for adjusting the current sources I2-3a and I2-3b. Note that, as in FIG. 1, the output signals Vlpfp and Vlpfm of the low pass filter 16 are digitized by the ADC 17 to produce the output signal OUT.

Operation of the circuit shown in FIG. 2 will now be described. Notice that the transistors T1 and T2 are bipolar junction transistors, which have a higher transconductance as compared to field effect transistors. However, bipolar junction transistors have the drawback of base current leakage at fast corners. To avoid degradation in performance due to this base leakage, the amplifiers 20 and 21 act as voltage regulators, maintaining the bias voltages on the bases of the transistors T1 and T2 respectively at Vinp+Vicm and Vinm+Vicm, and increasing the transconductance of the transistors T1 and T2.

Since the transistors T1 and T2 are configured as a differential amplifier, the difference between the differential input voltages Vinp+Vicm and Vinm+Vicm is amplified and passed as input to the amplifier 23, which provides further amplification and produces the output differential signals Voutp and Voutm. The second VGA 24 further amplifies the output differential signals Voutp and Voutm, and after low pass filtering by the low pass filter 16, the output differential signals Vlpfp and Vlpfm are produced.

Note that the currents I2-1a and I2-1b are constant and equal in magnitude to one another. Note also that the currents I1-1a and I1-1b are constant and equal in magnitude to one another. The magnitude of the current I2 is larger than the magnitude of the current I1, with the result being that the extra current flows through the feedback resistors R1, thereby shifting the common mode voltage Vcom of the output nodes of the differential amplifier at the collectors of the transistors T1 and T2 upward by R1*(I2-I1). This increase in the common mode voltage Vcom increases the operating margin (Vce margin) of the transistors T1 and T2, increases the transconductance of the transistors T1 and T2, and improves the linearity of the transistors T1 and T2.

Since the voltage Vinp will appear at the emitter of the transistor T1 and the voltage Vinm will appear at the emitter of the transistor T2, a small signal current will flow through the adjustable resistances Rs, yielding a gain of R1/Rs for the VGA 15.

The feedback loop formed by the connections of the amplifier 22 serves to modulate the currents sourced by current sources I2-2a and I2-2b (and therefore serves to modulate I2) so as to keep the collector to emitter voltages Vce of the transistors T1 and T2 constant as the input common mode voltage Vicm changes with respect to the reference input common mode voltage Vicmref. This improves linearity of the transistors T1 and T2 across the input signal range.

When the gain R1/Rs of the VGA 15 is to be increased by reducing Rs (for example, increasing the gain to over 40 dB), it is desired for the transconductance seen from the emitter sides of the transistors T1 and T2 to be much greater than 1/Rs. Since Rs is lowered to increase the gain of the VGA, the magnitude of the currents sunk by the adjustable current sources I1-2a and I1-2b are increased (and therefore the magnitude of the current I1 is increased) so as to increase the transconductance of the transistors T1 and T2. Together with this, the magnitude of the currents sourced by the current sources I2-3a and I2-3b is increased equally with the increase in the magnitude of the currents sunk by the adjustable current sources I1-2a and I1-2b (and therefore the magnitude of the current I2 is increased equally with the increase of the magnitude of the current I1) so as to not alter the common mode voltage Vcom.

A calibration is performed to cancel DC offset present in the input signals Vinp and Vinm. In calibration mode, the calibration enable signal Calib_en is set to a logic high, closing the switch S1 and shorting the non-inverting inputs of the amplifiers 20 and 21. Due this shorting, the differential output voltage represented by Vlpfp and Vlpfm should be zero in the absence of a DC offset. Therefore, in the calibration mode, the comparator 31 is enabled by the calibration enable signal Calib_en. If the differential output voltages Vlpfp and Vlpfm are not equal, the output of the comparator 31 will switch to a logic high or logic low, which will be read by the logic circuit 32. The logic circuit 32 will then modify the magnitude of the current output by the adjustable current source I2-3b with respect to the magnitude of the current output by the adjustable current source I2-3a, or vice versa, until the comparator 31 detects that the differential output voltages Vlpfp and Vlpfm are equal. At this point, the logic block 32 would maintain the magnitudes of the currents output by the adjustable current sources I2-3b and I2-3a at their current levels, since at this point, the DC offset in the differential output voltages Vlpfp and Vlpfm has been canceled.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A method, comprising:
   sinking a first current from a pair of input transistors of a differential amplifier while sourcing a second current to the pair of input transistors, wherein the second current is greater than the first current;
   generating a pair of input differential signals using a pair of input voltage regulators, and using the differential amplifier to amplify a difference between the pair of input differential signals to produce a pair of differential output voltages;
   amplifying the pair of differential output voltages using at least one voltage gain amplifier;
   generating control signals from the pair of differential output voltages after at least amplification for controlling current sources that source the first current to the pair of input transistors of the differential amplifier;
   increasing a transconductance of the pair of input transistors of the differential amplifier without increasing a common mode voltage by increasing the first current sourced to the pair of input transistors in equal magnitude to an increase in the second current sunk from the pair of input transistors.

2. The method of claim 1, further comprising maintaining a constant voltage across the pair of input transistors using the control signals for the current sources.

3. The method of claim 1, further comprising further comprising calibrating the differential amplifier by:
   shorting inputs to the pair of input voltage regulators to one another;
   comparing the pair of differential output voltages to one another; and
   adjusting the control signals for controlling the current sources based upon the comparison so that the pair of differential output voltages are equal.

4. The method of claim 1, further comprising low-pass filtering the pair of differential output voltages.

5. A circuit, comprising:
   a differential amplifier comprising first and second input transistors receiving first and second regulated input differential voltages, the first and second input transistors being coupled in a differential arrangement between first and second current sourcing circuits and first and second current sinking circuits, wherein the first and second current souring circuits are configured to source more current than is sunk by the first and second current sinking circuits;
   wherein the differential amplifier includes first and second resistances coupled in series between a first node at which the first input transistor and the first current sinking circuit are coupled and a second node at which the second input transistor and the second current sinking circuit are coupled;
   a first amplifier configured to generate an adjustment signal for the first and second current sourcing circuits based upon a difference between an input common mode reference voltage and a voltage at a tap between the first and second resistances; and
   an output amplification circuit configured to amplify differential output voltages from the differential amplifier to thereby produce final differential output voltages.

6. The circuit of claim 5, wherein an input common mode voltage is produced at the tap between the first and second resistances; wherein the first regulated input differential voltage is equal to a first input voltage plus the input common mode voltage; and
   wherein the second regulated input differential voltage is equal to a second input voltage plus the input common mode voltage.

7. The circuit of claim 6, wherein the first amplifier adjusts the currents sourced by the first and second current sourcing circuits such that voltages across the first and second input transistors remain constant as the input common mode voltage changes with respect to the input common mode reference voltage.

8. The circuit of claim 5, further comprising an adjustment circuit configured to adjust the currents sourced by the first and second current sourcing circuits based upon the final differential output voltages.

9. The circuit of claim 8, wherein the adjustment circuit is configured to adjust the currents sourced by the first and second current sourcing circuits so as to increase a magnitude in currents sourced by the first and second current sourcing circuits equally to increases in magnitude of the currents sunk by the first and second current sinking circuits.

10. The circuit of claim 8, wherein the adjustment circuit comprises a comparator configured to generate control signals for the first and second current sourcing circuits based upon a comparison between the final differential output voltages.

11. The circuit of claim 5, further comprising a filter circuit configured to filter the final differential output voltages.

12. A circuit, comprising:
   a differential amplifier comprising first and second input transistors receiving first and second regulated input differential voltages, the first and second input transistors being coupled in a differential arrangement between first and second current sourcing circuits and first and second current sinking circuits, wherein the first and second current souring circuits are configured to source more current than is sunk by the first and second current sinking circuits;
   an output amplification circuit coupled to amplify different output voltages from the differential amplifier to thereby produce final differential output voltages; and
   adjustment circuitry configured to adjust the currents sourced by the first and second current sourcing circuits such that voltage across the first and second input transistors remains constant, and such that the currents sourced by the first and second current sourcing circuits are adjusted in magnitude with adjustment to magnitude of the currents sunk by the first and second current sinking circuits.

13. The circuit of claim 12,
wherein the differential amplifier includes first and second resistances coupled in series between a first node at which the first input transistor and the first current sinking circuit are coupled and a second node at which the second input transistor and the second current sinking circuit are coupled; and
wherein the first and second current sourcing circuits are adjusted by the adjustment circuitry such that the voltage across the first and second input transistors remains constant based upon a comparison between an input common mode reference voltage and a voltage at a tap between the first and second resistances, and such that the currents sourced by the first and second current sourcing circuits are adjusted in magnitude with adjustment to magnitude of the currents sunk by the first and second current sinking circuits based upon a comparison between the final differential output voltages.

14. The circuit of claim 12, further comprising a filter circuit configured to filter the differential output voltages.

15. A circuit, comprising:
a voltage gain amplifier comprising:
   a first fixed current source configured to source a first current;
   a second fixed current source configured to source a second current;
   a third fixed current source configured to sink a third current;
   a fourth fixed current source configured to sink a fourth current;
   a first transistor having a first conduction terminal coupled to the first fixed current source, a second conduction terminal coupled to the third fixed current source, and a control terminal coupled to receive a first regulated differential input voltage;
   a first input amplifier having a first input receiving a first differential input signal, a second input coupled to the second conduction terminal of the first transistor, and an output generating the first regulated differential input voltage;
   a second transistor having a first conduction terminal coupled to the second fixed current source, a second conduction terminal coupled to the fourth fixed current source, and a control terminal coupled to receive a second regulated differential input voltage;
   a second input amplifier having a first input receiving a second differential input signal, a second input coupled to the second conduction terminal of the second transistor, and an output generating the second regulated differential input voltage;
   an output amplifier having inputs coupled to the first conduction terminals of the first and second transistors to receive differential output voltages therefrom, and outputs generating amplified differential output voltages therefrom;
   a resistance coupled between the second conduction terminals of the first and second transistors;
   a first adjustable current source coupled in parallel with the first fixed current source;
   a second adjustable current source coupled in parallel with the second fixed current; and
   an amplifier having a first input coupled to a center tap of the resistance and a second input coupled to a reference voltage, wherein the amplifier has an output at which a control signal of the first and second adjustable current sources is generated.

16. The circuit of claim 15, wherein the voltage gain amplifier further comprises:
   a third adjustable current source coupled in parallel with the first fixed current source and the first adjustable current source;
   a fourth adjustable current source coupled in parallel with the second fixed current source and the second adjustable current source;
   a fifth adjustable current source coupled in parallel with the third fixed current source; and
   a sixth adjustable current source coupled in parallel with the fourth fixed current source.

17. The circuit of claim 16, further comprising an additional voltage gain amplifier having inputs receiving the amplified differential output voltages and outputs generating further amplified differential output voltages, and a low pass filter configured to filter the further amplified differential output voltages to produce final differential output voltages.

* * * * *